United States Patent
Maeda et al.

[11] Patent Number: 6,106,998
[45] Date of Patent: Aug. 22, 2000

[54] NEGATIVE RESIST MATERIALS, PATTERN FORMATION METHOD MAKING USE THEREOF, AND METHOD OF MANUFACTURING SEMICONDUCTOR DEVICES

[75] Inventors: Katsumi Maeda; Shigeyuki Iwasa; Kaichiro Nakano; Etsuo Hasegawa, all of Tokyo, Japan

[73] Assignee: NEC Corporation, Tokyo, Japan

[21] Appl. No.: 09/094,021

[22] Filed: Jun. 9, 1998

[30] Foreign Application Priority Data

Jun. 19, 1997 [JP] Japan ..................................... 9-162716
Dec. 12, 1997 [JP] Japan ..................................... 9-343262

[51] Int. Cl.[7] .................................................. G03F 7/038
[52] U.S. Cl. ........................ 430/280.1; 522/129; 522/154
[58] Field of Search ........................ 430/280.1; 522/129, 522/154

[56] References Cited

U.S. PATENT DOCUMENTS

| | | | |
|---|---|---|---|
| 5,665,518 | 9/1997 | Maeda et al. | 430/270.1 |
| 5,738,975 | 4/1998 | Nakano et al. | 430/280.1 |

FOREIGN PATENT DOCUMENTS

| | | |
|---|---|---|
| 2-27660 | 1/1990 | Japan . |
| 5-134416 | 5/1993 | Japan . |
| 6-348017 | 12/1994 | Japan . |
| 7-33855 | 2/1995 | Japan . |
| 7-252324 | 10/1995 | Japan . |
| 8-259626 | 10/1996 | Japan . |
| 8259626 | 10/1996 | Japan . |

OTHER PUBLICATIONS

Huang et al, 126:285196, Abstract of Proc. SPIE—Int. Soc. Opt. Eng (1996), 2724 (Advances in Resist Technology and Processing XIII) pp. 315–322, in Chemical Abstracts, American Chemical Society, 1999.

R.D. Allen et al., "Progress in 193nm Positive Resists", Journal of Photopolymer Science and Technology, vol. 9, No. 3, (1996), pp. 465–474.

R.D.Allen et al., "Resolution and Etch Resistance of a Family of 193 nm Positive Resists", Journal of Photopolymer Science and Technology, vol. 8, No. 4, (1995), pp. 623–636.

J.V.Crivello et al., "A new Preparation of Triarylaulfonlum and –selenonium Salts via the Cooper II)–Catalyzed arylation of Sulfides and Selenides with Diaryliodonium Salts", Journal of Organic Chemistry, vol. 43, No. 15, 1978, pp. 3055–3058.

(List continued on next page.)

*Primary Examiner*—Cynthia Hamilton
*Attorney, Agent, or Firm*—Young & Thompson

[57] ABSTRACT

A negative resist material suitable for lithography employing for exposure a beam having a wavelength of 220 nm or less. The negative resist material contains a polymer having a weight average molecular weight of 1,000–500,000 and represented by the following formula (1):

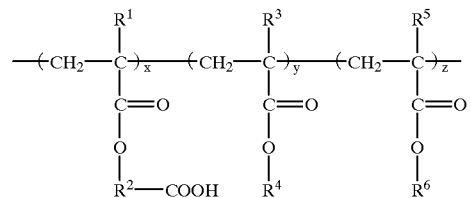

wherein $R^1$, $R^3$, and $R^5$ are hydrogen atoms or methyl groups; $R^2$ is a specified divalent hydrocarbon group; $R^4$ is a hydrocarbon group having an epoxy group; $R^6$ is a hydrogen atom or a $C_{1-12}$ hydrocarbon group; and each of x, y, and z represents an arbitrary number satisfying certain relations; a photoacid generator generating an acid through exposure; and optionally a polyhydric alcohol or a polyfunctional epoxy group. The present invention also discloses a pattern formation method, and a method of manufacturing semiconductor devices using the pattern formation method.

6 Claims, 1 Drawing Sheet

OTHER PUBLICATIONS

D.C. Hofer et al., "193 nm Photoresist R&D: The Risk & Challenge", Journal of Photopolymer Science and Technology, vol. 9, No. 3, (1996) pp. 387–398.

F.M. Houlihan et al., "The Synthesis, Characterization and Lithography of α–Substituted 2–Nitrobenzyl Arylsulfonate Photo–Acid Generators with Improved Resistance to Post Exposure Bake", SPIE Proceedings, vol. 2195, 1994, pp. 137–151.

H. Ito et al., "Applications of Photoinitiators to the Design of Resists for Semiconductor Manufacturing", American Chemical Society Symposium Series Col. 242, (1984), pp. 11–23.

S. Takechi et al., "Alicyclic Polymer for ArF and KrF Excimer Resist Based on Chemical Amplification", Journal of Photopolymer Science and Technology, vol. 5, No. 3, (1992) pp. 439–446.

T. Ueno et al., "Chemical Amplification Positive Resist Systems Using Novel Sulfonates as Acid Generators", Proceedings of PME '89, (1990), pp. 413–424.

NEGATIVE RESIST MATERIALS, PATTERN FORMATION METHOD MAKING USE THEREOF, AND METHOD OF MANUFACTURING SEMICONDUCTOR DEVICES

BACKGROUND OF THE INVENTION

1. Field of the Invention

The present invention relates to photolithography steps in manufacturing semiconductor elements, particularly to negative resist materials suitable for lithography employing for exposure lignt having a wavelength of 220 nm or less, to a pattern formation method, and to a method of manufacturing semiconductor devices using the pattern formation method.

2.. Background Art

In the field of manufacture of electronic devices which require micro-processing on a half-micron scale, typically semiconductor devices, keen demand has arisen for development of devices, of higher density and higher degrees of integration. Therefore, more advanced photolithographic technology is needed for micro-pattern formation.

As one means to make patterns finer, there is a method in which an exposure light having a shorter wavelength is employed for the formation of resist patterns. At present, studies are energetically conducted on the use, as a light source for exposure, of a KrF excimer laser (wavelength= 248 nm) instead of an i-line (wavelength=365 nm) in mass-production processes of 256 Mbit DRAMs (process dimension 0.25 $\mu$m or less).

However, for the manufacture of DRAMs having an integration degree of 1 Gbit or more—which requires processing technology on more minute levels (process dimension 0.18 $\mu$m or less)—a light source having an even shorter wavelength is needed. Specifically, photolithography by use of an ArF excimer laser (193 nm) has recently been proposed (Donald C. Hoffer, et al., *Journal of Photopolymer Science and Technology*, Vol. 9 (No. 3), p387–p397 (1996)).

Thus, the development of negative photoresists suitable for use in photolithography that employs an ArF excimer laser has been demanded. In relation to the development of such resists for use with an ArF excimer laser, a laser of improved cost performance is desired, in view that the source gas for laser oscillation has a short service life; a laser apparatus itself is expensive; and other factors. Therefore, in addition to a higher level of resolution that corresponds to a more minute process dimension, there arises a strong demand for higher sensitivity.

Chemically amplified resists making use of a photoacid generator—which is a photosensitizing agent—have been well known to improve sensitivity of resists. As a typical example, mention may be given of the invention disclosed in Japanese Patent Application Laid-Open (kokai) No. 2-27660. This publication discloses a resist containing triphenylsulfonium hexafluoroarsenate and poly(p-tert-butoxycarbonyloxy-α-methylstyrene) in combination. At present, such a chemically amplified resist is widely used as an excimer laser resist (e.g., Hiroshi Ito, C. Grantwilson, American Chemical Society Symposium Series Vol. 242, p11–p23 (1984)). Chemically amplified resists are characterized in that a photoacid generator serving as the resist component generates a protonic acid by light irradiation and the acid causes acid-catalyzed reaction with a resist resin, etc. through thermal treatment after exposure. Thus, sensitivity is dramatically enhanced compared with the case of a conventional resist having photoreaction efficiency (occurrence of reaction caused by one photon) of less than one.

At the present time most developed resists are of the chemically-amplified-type, and therefore the introduction of a chemical amplification mechanism is essential for the development of high-sensitivity materials that cope with shortening of the wavelength of an exposure light source.

However, in the case of lithography using light having a wavelength as short as 220 nm or less, typically an ArF excimer laser, a negative resist for forming micro-patterns must have new characteristics which conventional resist materials cannot possess, i.e., high transparency to exposure light having a wavelength of 220 nm or less and dry-etch resistance.

Conventional negative photoresists for g-line (438 nm), i-line (365 nm), and KrF excimer laser (248 nm) are mainly formed of a resin and a crosslinking agent, wherein a resin having an aromatic ring in the structural unit such as a novolak resin or poly(p-vinylphenol) is used as the resin component. Etch resistance of the resin is maintained due to the dry-etch resistance of the aromatic ring. With regard to the crosslinking agent, there are used an azide compound such as 2,6-di(4'-azidobenzal)-4-methylcyclohexanone or 3,3'-diazidophenyl sulfone, and a methylolmelamine resin. However, resins having an aromatic ring exhibit strong photoabsorption to light having a wavelength of 220 nm or less. For this reason, most exposure light is absorbed at the surface of the resist and the light cannot reach the substrate, so that fine resist patterns cannot be formed. Therefore, conventional resins cannot be adapted to photolithography employing light having a wavelength as short as 220 nm or less. Accordingly, strong need exists for negative photoresist materials having no aromatic ring, being endowed with etch resistance, and exhibiting transparency to light having a wavelength of 220 nm or less.

As polymer compounds having transparency to an ArF excimer laser (193 nm) and dry-etch resistance there have been proposed alicyclic polymers such as a copolymer having an adamantyl methacrylate unit (Takechi et al., *Journal of Photopolymer Science and Technology*, Vol. 5, No. 3, p439–p446 (1992)) or a copolymer having an isobornyl methacrylate unit (R. D. Allen et al., *Journal of Photopolymer Science and Technology*, Vol. 8, No. 4, p623–p636 (1995) and Vol. 9, No. 3, p465–p474 (1996)).

Previously, the present inventors have developed resins which serve as resist materials and also satisfy the above-mentioned requirements (Japanese Patent Application Laid-Open (kokai) Nos. 7-252324 and 8-259626). However, the resist materials disclosed therein are chemically amplified positive resists comprising a resin having an acid-decomposable group and a photoacid generator and provide a positive pattern. Thus, no negative resist satisfying the above requirements has yet been developed.

Accordingly, there exists need for a high-sensitivity negative resist having excellent transparency and etch resistance suitable for lithography employing an exposure light having a wavelength of 220 nm or less, particularly 180–220 nm, and for a pattern formation method using such a negative resist material. Moreover, there exists need for a method of manufacturing semiconductor devices including pattern formation making use of the pattern formation method of the present invention.

SUMMARY OF THE INVENTION

According to a first aspect of the present invention, there is provided a negative photoresist material comprising a polymer having a weight average molecular weight of 1000–500,000 and represented by the following formula (1):

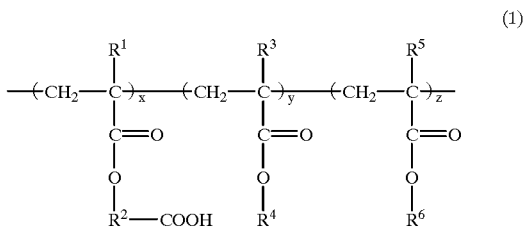

wherein each of $R^1$, $R^3$ and $R^5$ represents a hydrogen atom or a methyl group; $R^2$ represents a $C_{7-18}$ divalent hydrocarbon group having a bridged cyclic hydrocarbon group; $R^4$ represents a hydrocarbon group having an epoxy group; $R^6$ represents a hydrogen atom or a $C_{1-12}$ hydrocarbon group; and each of x, y, and z represents an arbitrary number satisfying the following conditions: x+y+z=1, 0<x<1, 0<y<1, and 0≦z<1; and a photoacid generator generating an acid through exposure.

According to a second aspect of the present invention, there is provided a negative photoresist material comprising the above-mentioned polymer of formula (1) and the photoacid generator, and a polyhydric alcohol.

Preferably, the photoresist material of the present invention also contains a polyfunctional epoxy compound.

According to a third aspect of the present invention, there is provided a negative photoresist material comprising a polymer having a weight average molecular weight of 1000–500,000 and represented by the following formula (2):

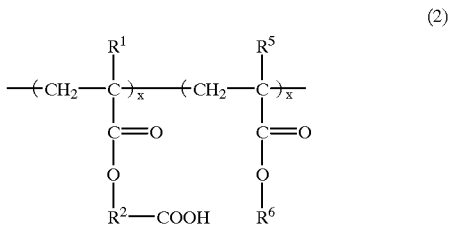

wherein each $R^1$ and $R^5$ represents a hydrogen atom or a methyl group; $R^2$ represents a $C_{7-18}$ divalent hydrocarbon group having a bridged cyclic hydrocarbon group; $R^6$ represents a hydrogen atom or a $C_{1-12}$ hydrocarbon group; each of x and z represents an arbitrary number satisfying the following conditions: x+z=1, 0<x≦1, and 0≦z<1; a photoacid generator generating an acid through exposure; and a polyfunctional epoxy compound.

According to a fourth aspect of the present invention, there is provided a negative photoresist material comprising the above-mentioned polymer of formula (2), the photoacid generator, the polyfunctional epoxy compound, and a polyhydric alcohol.

According to a fifth aspect of the present invention, there is provided a pattern formation method comprising the following steps of applying any of the above-described resist material onto a substrate to be processed; exposing the resultant product to light; baking; and developing.

Preferably, the exposure light has a wavelength of 180–220 nm and an ArF excimer laser is preferably employed as the exposure light.

According to a sixth aspect of the present invention, there is provided a method for manufacturing semiconductor devices through the above-described pattern formation method.

The other features, objects, and advantages of the present invention will become apparent from the following description.

Specifically, as will be understood from the description provided herein, the negative resist materials of the present invention have excellent dry-etch resistance and transparency, enabling formation of micropatterns called for manufacture of semiconductor elements.

BRIEF DESCRIPTION OF THE DRAWINGS

FIGS. 1A through 1D schematically show the resist pattern formation method of the present invention, in which FIG. 1A shows the first step of the pattern formation process;

FIG. 1B shows the second step of the pattern formation process;

FIG. 1C shows the third step of the pattern formation process; and

FIG. 1D shows the fourth step of the pattern formation process.

PREFERRED EMBODIMENTS OF THE PRESENT INVENTION

Figure 1A:
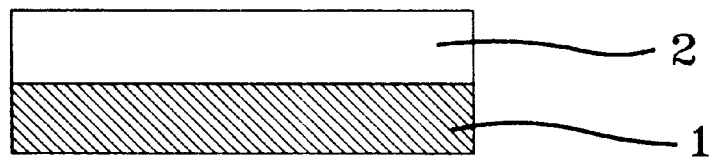

The present invention will next be described in detail.

In formula (1), each of $R^1$, $R^3$, and $R^5$ represents a hydrogen atom or a methyl group and $R^2$ represents a $C_{7-18}$ divalent hydrocarbon group having a bridged cyclic hydrocarbon group. Specific examples of $R^2$ include, but are not limited to, a tricyclo[$5.2.1.0^{2,6}$]decylmethyl group, a tricyclo[$5.2.1.0^{2,6}$]-decanediyl group, an adamantanediyl group, a norbornanediyl group, a methylnorbornanediyl group, an isobornanediyl group, a tetracyclo[$4.4.0.1^{2,5}.1^{7,10}$]-dodecanediyl group, a methyltetracyclo[$4.4.0.1^{2,5}.1^{7,10}$]-dodecanediyl group, a hexacyclo[$6.6.1.1^{3,6}.1^{10,13}.0^{2,7}.0^{9,14}$]-heptadecanediyl group, a methylhexacyclo-[$6.6.1.1^{3,6}.1^{10,13}.0^{2,7}.0^{9,14}$]heptadecanediyl group, as shown in Table 1.

$R^4$ represents a hydrocarbon group having an epoxy group. Specific examples of $R^4$ include, but are not limited to, a glycidyl group, a 3,4-epoxy-1-cyclohexylmethyl group, a 5,6-epoxy-2-bicyclo[2.2.1]heptyl group, a 5(6)-epoxyethyl-2-bicyclo[2.2.1]heptyl group, a 5,6-epoxy-2-bicyclo[2.2.1]-heptylmethyl group, a 3,4-epoxytricyclo[$5.2.1.0^{2,6}$]decyl group, a 3,4-epoxytricyclo[$5.2.1.0^{2,6}$]decyloxyethyl group, a 3,4-epoxytetracyclo[$4.4.0.1^{2,5}.1^{7,10}$]dodecyl group, and a 3,4-epoxytetracyclo[$4.4.0.1^{2,5}.1^{7,10}$]dodecylmethyl group.

$R^6$ represents a hydrogen atom or a $C_{1-12}$ hydrocarbon group. Specific examples of the hydrocarbon group include, but are not limited to, a methyl group, an ethyl group, an n-propyl group, an isopropyl group, an n-butyl group, an isobutyl group, a t-butyl group, a cyclohexyl group, a dimethylcyclohexyl group, a tricyclo[$5.2.1.0^{2,6}$]decyl group, an adamantyl group, a norbornyl group, and an isobornyl group.

In formula (1), each of x, y, and z represents an arbitrary number satisfying the following conditions: x+y+z=1; 0<x<1; 0<y<1; and 0≦z<1.

In formula (2), each of x and z represents an arbitrary number satisfying the following conditions: x+z=1; 0<x≦1; and 0≦z<1, and $R^1$, $R^2$, $R^5$, and $R^6$ have the same meanings as described for formula (1).

The above-described polymer used in the present invention has a weight average molecular weight of 1,000–500,000, with 3,000–200,000 being preferred.

TABLE 1
| R² | Chemical structure |
|---|---|
| tricyclo[5.2.1.0²,⁶]decylmethyl | 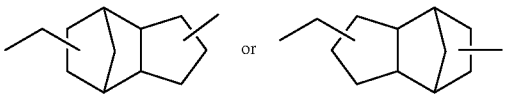 |
| tricyclo[5.2.1.0²,⁶]decanediyl | 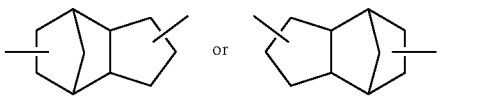 |
| adamantanediyl | 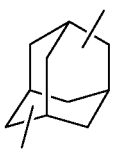 |
| norbornanediyl | 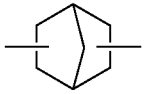 |
| methylnorbornanediyl | 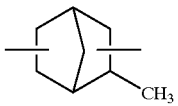 |
| isobornanediyl | 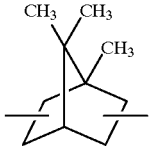 |
| tetracyclo[4.4.0.1²,⁵.1⁷,¹⁰]dodecanediyl | 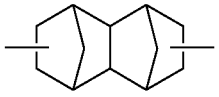 |
| methyltetracyclo[4.4.0.1²,⁵.1⁷,¹⁰]dodecanediyl |  |
| hexacyclo[6.6.1.1³,⁶.1¹⁰,¹³.0²,⁷.0⁹,¹⁴]heptadecanediyl |  |
| methylhexacyclo[6.6.1.1³,⁶.1¹⁰,¹³.0²,⁷.0⁹,¹⁴]heptadecanediyl | 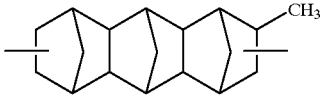 |
TABLE 2
| R⁴ | Chemical structure |
|---|---|
| glycidyl | 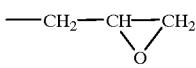 |

TABLE 2-continued

| R⁴ | Chemical structure |
|---|---|
| 3,4-epoxy-1-cyclohexylmethyl | |
| 5,6-epoxy-2-bicyclo[2.2.1]heptyl | |
| 5(6)-epoxyethyl-2-bicyclo[2.2.1]heptyl | |
| 5,6-epoxy-2-bicyclo[2.2.1]heptylmethyl | |
| 3,4-epoxytricyclo[5.2.1.0$^{2,6}$]decyl | |
| 3,4-epoxytricyclo[5.2.1.0$^{2,6}$]decyloxyethyl | |
| 3,4-epoxytetracyclo[4.4.0.1$^{2,5}$.1$^{7,10}$]dodecyl | |
| 3,4-epoxytetracyclo[4.4.0.1$^{2,5}$.1$^{7,10}$]dodecylmethyl | |

The polymer represented by formula (1) may be manufactured through a typical polymerization method such as radical polymerization or ionic polymerization by use of (meth)acrylate monomers represented by the following formulas (3), (4), and (5):

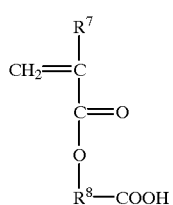

(3)

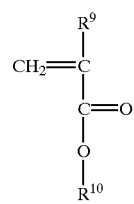

(4)

wherein $R^7$ represents a hydrogen atom or a methyl group and $R^8$ represents a $C_{7-18}$ divalent hydrocarbon group having a bridged cyclic hydrocarbon group;

wherein $R^9$ represents a hydrogen atom or a methyl group and $R^{10}$ represents a hydrocarbon group having an epoxy group; and

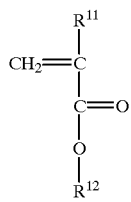

(5)

wherein $R^{11}$ represents a hydrogen atom or a methyl group and $R^{12}$ represents a hydrogen atom or a $C_{1-12}$ hydrocarbon group.

The polymer represented by formula (2) may similarly be manufactured by use of (meth)acrylate monomers represented by the formulas (3) and (5).

The polymerization is conducted, for example, through stirring the monomers in anhydrous tetrahydrofuran in the presence of an appropriate radical polymerization initiator (e.g., azobisisobutyronitrile (AIBN)) at 50–70° C. for 0.5–12 hours in an inert gas (e.g., argon or nitrogen) atmosphere. The polymer of the present invention has a weight average molecular weight of 1000–500,000, preferably 3000–200,000. A desired copolymer may be obtained through selection of the ratio of feed monomers and other polymerization conditions.

The (meth)acrylate monomer represented by formula (3) and serving as a raw material of the polymer is obtained through a method which the present inventors have already disclosed in Japanese Patent Application Laid-Open (kokai) No. 8-259626. Among the monomers having an epoxy group represented by formula (4), 3,4-epoxytricyclo[5.2.1.0$^{2,6}$] decyl acrylate represented by the below-described formula (6), for example, is obtained by subjecting dicyclopentenyl acrylate to epoxidation (in acetic acid) with peracetic acid. Similarly, 5,6-epoxy-2-bicyclo[2.2.1]heptyl methacrylate represented by the below-described formula (7) and 3,4-epoxytetracyclo-[4.4.0.1$^{2,5}$.1$^{7,10}$]dodecyl acrylate represented by the below-described formula (8) are obtained from 5-norbornene-2-methacrylate and tetracyclo[4.4.0.1$^{2,5}$.1$^{7,10}$] dodecenyl acrylate subjected to epoxidation, respectively.

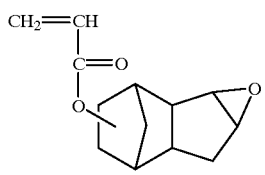

(6)

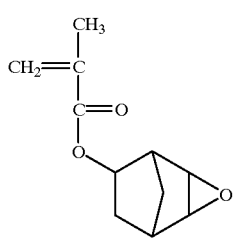

(7)

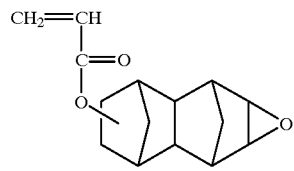

(8)

The negative resist material of the present invention contains a constituent polymer typically in an amount of 40–99.8 parts by weight with respect to 100 parts by weight of the entirety of the components including the polymer component, preferably 60–99 parts by weight.

No particular limitation is imposed on the polyhydric alcohol used in the present invention, and examples thereof include ethylene glycol, glycerol, 1,2-butanediol, 1,3-butanediol, 1,4-butanediol, 2,3-butanediol, 1,2,4-butanetriol, 1,2-pentanediol, 1,4-pentanediol, 1,5-pentanediol, 2,4-pentanediol, 1,2-hexanediol, 1,5-hexanediol, 1,6-hexanediol, 2,5-hexanediol, 1,2-cyclohexanediol, 1,3-cyclohexanediol, 1,4-cyclohexanediol, 1,2-cyclohexanedimethanol, 1,4-cyclohexanedimethanol, 1,3,5-cyclohexanetrimethanol, 1,2-cyclopentanediol, 1,3-cyclopentanediol, 1,2-cyclooctanediol, 1,5-cyclooctanediol, tricyclodecanedimethanol, 2,3-norbornanediol, 2(3)-hydroxy-5,6-bis(hydroxymethyl)norbornane, 2,3-dihydroxy-5(6)-hydroxymethylnorbornane, 1,4-anhydroerythritol, L-arabinose, L-arabitol, D-cellobiose, cellulose, 1,5-decalindiol, glucose, galactose, lactose, maltose, mannose, and mannitol.

The content of the polyhydric alcohol is typically 1–40 parts by weight with respect to 100 parts by weight of the entirety of the components including the alcohol component, preferably 5–30 parts by weight. The polyhydric alcohol may be used singly or in combination of two or more species.

The desirable photoacid generator used in the present invention generates an acid when being irradiated by light having a wavelength of 400 nm or less, preferably 180–220 nm, and any photoacid generator may be used so long as a mixture thereof containing the above-described polymer compounds of the present invention is sufficiently soluble to an organic solvent and the resultant solution can provide a homogeneous film through use of a film formation method such as spin-coating. The photoacid generator may be used singly or in combination of two or more species.

Examples of the photoacid generator which may be used include a triphenylsulfonium salt derivative (J. V. Crivello et al., *Journal of the Organic Chemistry*, Vol. 43, No. 15, p3055–p3058 (1978)); other onium salts including the triphenylsulfonium salt (e.g., a sulfonium salt, a iodonium salt, a phosphonium salt, a diazonium salt, or an ammonium salt); 2,6-dinitrobenzyl esters (O. Nalamasu et al., *SPIE Proceeding*, Vol. 2195, p137 (1994)); 1,2,3-tri (menthanesulfonyloxy)benzene (Takumi Ueno et al., Proceeding of PME '89, Kodansha Co., Ltd., p413–p424 (1990)); and sulfosuccinimide disclosed in Japanese Patent Application Laid-Open (kokai) No. 5-134416.

The content of the photoacid generator is typically 0.2–30 parts by weight with respect to 100 parts by weight of the entirety of the components including the photoacid generator, preferably 1–15 parts by weight. The photoacid generator contained in an amount of 0.2 parts by weight or more results in sufficient sensitivity and easy pattern-formation. When the content is 30 parts by weight or less, homogeneous film is easily formed and scum generation is prevented after development.

No particular limitation is imposed on the polyfunctional epoxy compounds used in the present invention, and examples thereof include hydrogenated bisphenol A diglycidyl ether, ethylene glycol diglycidyl ether, diethylene glycol diglycidyl ether, propylene glycol diglycidyl ether, tripropylene glycol diglycidyl ether, neopentyl glycol diglycidyl ether, 1,6-hexanediol diglycidyl ether, glycerin diglycidyl ether, trimethylolpropane triglycidyl ether, 1,2-cyclohexanecarboxylic acid diglycidyl ether, 3,4-epoxycyclohexanecarboxylic acid, 3,4-epoxycyclohexylmethyl, tris(epoxypropyl)isocyanurate, 2-epoxyethylbicyclo[2.2]heptylglycidyl ether, heptyl glycidyl ether, ethylene glycol bis(2-epoxyethylbicyclo[2.2.]heptyl) ether, and bis(2-epoxyethylbicyclo[2.2.]heptyl) ether. The content of the polyfunctional epoxy compound is typically 0.5–40 parts by weight with respect to 100 parts by weight of the entirety of the components including the epoxy compound, preferably 1–30 parts by weight. Particularly, in the case in which the polymer represented by formula (1) is used, the content is preferably 1–20 parts by weight, whereas in the case in which the polymer represented by formula (2) is used, 5–30 parts by weight. The epoxy compound may be used singly or in combination of two or more species.

Any organic solvent may be used in the present invention so long as it can satisfactorily dissolve the components employed and the resultant solution can provide a homogeneous film through a film formation method such as spin-coating. The solvent may be used singly or in combination of two or more species. Examples of solvents include, but are not limited to, n-propyl alcohol, isopropyl alcohol, n-butyl alcohol, tert-butyl alcohol, methyl cellosolve acetate, ethyl cellosolve acetate, propylene glycol monoethyl ether acetate, methyl lactate, ethyl lactate, 2-methoxybutyl acetate, 2-ethoxyethyl acetate, methyl pyruvate, ethyl pyruvate, methyl 3-methoxypropionate, ethyl 3-methoxypropionate, N-methyl-2-pyrrolidinone, cyclohexanone, cyclopentanone, cyclohexanol, methyl ethyl ketone, 1,4-dioxane, ethylene glycol monomethyl ether, ethylene glycol monomethyl ether acetate, ethylene glycol monoethyl ether, ethylene glycol monoisopropyl ether, diethylene glycol monomethyl ether, and diethylene glycol dimethyl ether.

The resist material of the present invention may further contain, in addition to the above-described components, a variety of additives, which include surfactants, colorants, stabilizers, coatability-improvers, and dyes.

Figure 1B:
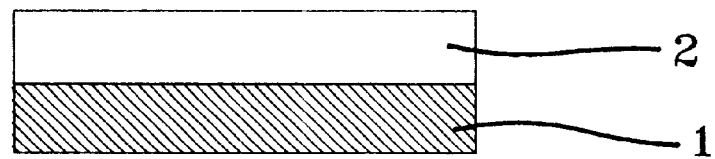
Figure 1C:
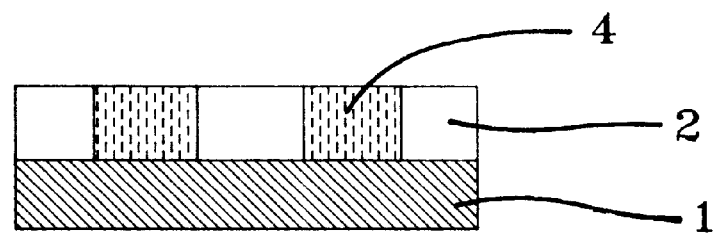
Figure 1D:
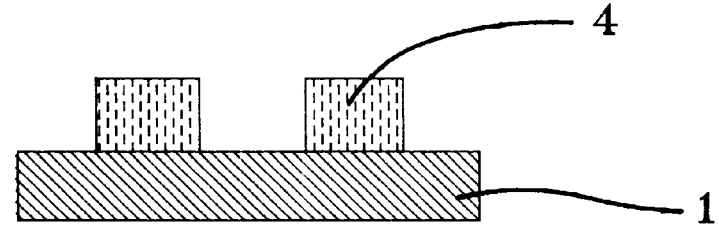

According to the fifth aspect of the present invention, there is provided a pattern formation method for a negative photoresist pattern on a substrate to be processed through use of the above-described negative photoresist material. The negative pattern formation method of the present invention is shown in FIG. 1A through FIG. 1D. Firstly, a negative photoresist material of the present invention is applied onto a substrate 1 to be processed and baked at 60–170° for 30–240 seconds by use of heating means such as hot plates to form resist film 2. Then, the resist film is selectively exposed by use of an exposure apparatus as shown in FIG. 1B. After exposure, the resist film 2 is treated with heat, so as to cause a ring-opening polymerization reaction of epoxy groups in the exposed areas due to the action of an acid generated from the photoacid generator. Crosslinking of the resin then occurs to form cross-linked areas 4 as shown in FIG. 1C. In the case in which the resist material of the present invention contains a polyhydric alcohol referred to in connection with the second and fourth aspects, reaction of epoxy groups with the polyhydric alcohol is also induced by the action of the acid, to cause crosslinking. Crosslinking of the resin is accelerated as compared with the case in which no polyhydric alcohol is added. Finally, unexposed portions of the resist film 2 are selectively dissolved by use of an alkaline developer such as an aqueous tetramethylammonium hydroxide (TMAH) solution and removed to form a negative pattern.

The negative photoresist material of the present invention exhibits high transparency to light having a wavelength of 220 nm or less and high dry-etch resistance and may be used for a new negative photoresist material. Furthermore, the negative photoresist material of the present invention enables negative pattern formation when used for photolithography.

EXAMPLES

The present invention will next be described in detail by way of examples, which should not be construed as limiting the invention thereto.

Synthesis Example 1

Synthesis of the below-described polymer (formula (1), wherein $R^1$ represents a methyl group; $R^2$ represents a tetracyclo[$4.4.0.1^{2,5}.1^{7,10}$]dodecanediyl group; $R^3$ represents a hydrogen atom; $R^4$ represents a 3,4-epoxytricyclo [$5.2.1.0^{2,6}$]decyl group; x=0.7; y=0.3; and z=0).

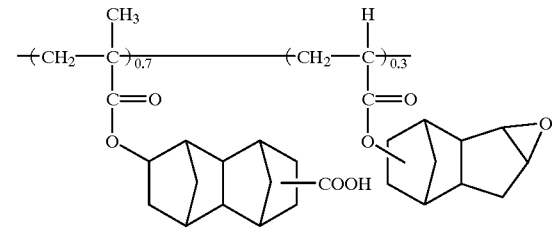

Carboxytetracyclododecyl methacrylate (3.075 g) and 3,4-epoxytricyclo[$5.2.1.0^{2,6}$]decyl acrylate (1 g) were dissolved in anhydrous tetrahydrofuran (27 ml) in a 100 ml round-bottomed flask equipped with a reflux condenser. AIBN (223 mg, 50 mmol/L) was added thereto and the mixture was stirred at 60–65° C. in an argon atmosphere. Two hours later, the mixture was allowed to cool and was poured into ligroin (300 ml). The precipitate was separated by filtration, and was further purified by another reprecipitation process to thereby obtain a target polymer (2.851 g, yield 70%). The monomer ratio in the copolymer as determined by the integral area ratio of $^1$H-NMR was 7:3 (x=0.7, y=0.3). The weight average molecular weight (Mw) was 22,300 (reduced to polystyrene) and the polydispersity (Mw/Mn) was 2.15, as determined by GPC analysis.

Synthesis Examples 2 and 3

The procedure of Synthesis Example 1 was performed while the monomer feed ratio was changed. The monomer feed ratios, monomer ratios in the copolymers (x/y), and weight average molecular weights are shown in Table 3 provided below.

TABLE 3

|  | Feed ratio | x/y | Wt. av. molecular wt. |
| --- | --- | --- | --- |
| Synthesis Ex. 2 | 0.1/0.9 | 0.1/0.9 | 17,800 |
| Synthesis Ex. 3 | 0.5/0.5 | 0.49/0.51 | 19,000 |

Synthesis Examples 4 and 5

The procedure of Synthesis Example 1 was performed while the amount (concentration) of AIBN was changed. The monomer ratios in the copolymers (x/y) and weight average molecular weights are shown in Table 4 provided below.

TABLE 4

|  | Concentration of AIBN | x/y | Wt. av. molecular wt. |
|---|---|---|---|
| Synthesis Ex. 4 | 5 mmol/L | 0.71/0.29 | 168,000 |
| Synthesis Ex. 5 | 80 mmol/L | 0.7/0.3 | 5700 |

Synthesis Example 6

Synthesis of the below-described polymer (formula (1), wherein each of $R^1$ and $R^3$ represents a methyl group; $R^2$ represents a tetracyclo[$4.4.0.1^{2,5}.1^{7,10}$]dodecanediyl group; $R^4$ represents a glycidyl group; x=0.7; y 0.3; and z=0).

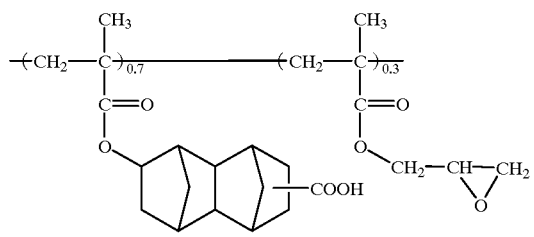

The procedure of Synthesis Example 1 was performed through use of glycidyl methacrylate (Light Ester G, product of Kyoei-sha Kagaku K. K.) instead of 3,4-epoxytricyclo [$5.2.1.0^{2,6}$]decyl acrylate, to thereby obtain the above polymer (Mw=24,500, Mw/Mn=1.92).

Synthesis Example 7

Synthesis of the below-described polymer (formula (1), wherein each of $R^1$ and $R^3$ represents a methyl group; $R^2$ represents a tetracyclo[$4.4.0.1^{2,5}.1^{7,10}$]dodecanediyl group; $R^4$ represents a 3,4-epoxy-1-cyclohexylmethyl group; x=0.7; y=0.3; and z=0).

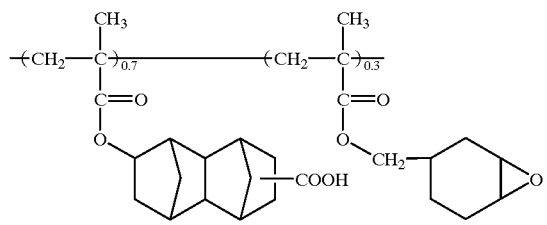

The procedure of Synthesis Example 1 was performed through use of 3,4-epoxy-1-cyclohexylmethyl methacrylate (Cyclomer M100, product of Daicel Chemical Industries, Ltd.) instead of 3,4-epoxytricyclo[$5.2.1.0^{2,6}$]decyl acrylate, to thereby obtain the above polymer (Mw=21,000, Mw/Mn=1.88).

Synthesis Example 8

Synthesis of the below-described polymer (formula (1), wherein each of $R^1$ and $R^3$ represents a methyl group; $R^2$ represents a tetracyclo[$4.4.0.1^{2,5}.1^{7,10}$]dododecanediyl group; $R^4$ represents a 5,6-epoxy-2-bicyclo[2.2.1]heptyl group; x=0.7; y=0.3; and z=0).

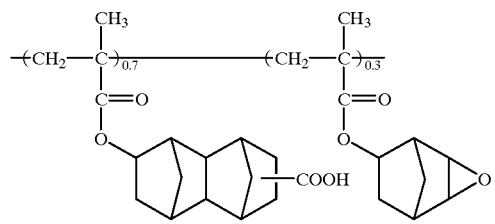

The procedure of Synthesis Example 1 was performed through use of 5,6-epoxy-2-bicyclo[2.2.1]heptyl methacrylate instead of 3,4-epoxytricyclo[$5.2.1.0^{2,6}$]decyl acrylate, to thereby obtain the above polymer (Mw=20,800, Mw/Mn=2.03).

Synthesis Example 9

Synthesis of the below-described polymer (formula (1), wherein $R^1$ represents a methyl group; $R^2$ represents a norbornanediyl group; $R^3$ represents a hydrogen atom; $R^4$ represents a 3,4-epoxytricyclo[$5.2.1.0^{2,6}$]decyl group; x=0.7; y=0.3; and z=0).

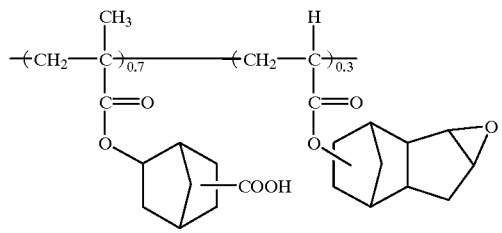

The procedure of Synthesis Example 1 was performed through use of carboxynorbornyl methacrylate instead of carboxytetracyclododecyl methacrylate, to thereby obtain the above polymer (Mw=22,500, Mw/Mn=2.06).

Synthesis Example 10

Synthesis of the below-described polymer (formula (1), wherein $R^1$ represents a methyl group; $R^2$ represents a tricyclo[$5.2.1.0^{2,6}$]decylmethyl group; $R^3$ represents a hydrogen atom; $R^4$ represents a 3,4-epoxytricyclo-[$5.2.1.0^{2,6}$]decyl group; x=0.7; y=0.3; and z=0).

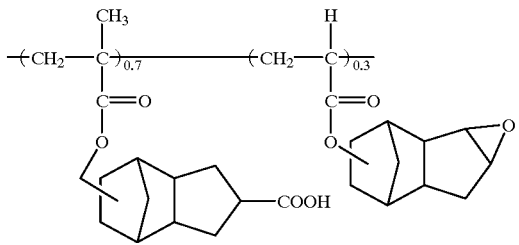

The procedure of Synthesis Example 1 was performed through use of carboxytricyclodecylmethyl methacrylate instead of carboxytetracyclododecyl methacrylate, to thereby obtain the above polymer (Mw=21,800, Mw/Mn=2.12).

Synthesis Example 11

Synthesis of the below-described polymer (formula (1), wherein $R^1$ represents a methyl group; $R^2$ represents a tetracyclo[$4.4.0.1^{2,5}.1^{7,10}$]dodecanediyl group; $R^3$ represents a hydrogen atom; $R^4$ represents a 3,4-epoxytetracyclo-[$4.4.0.1^{2,5}1^{7,10}$]dodecyl group; x=0.7; y=0.3; and z=0).

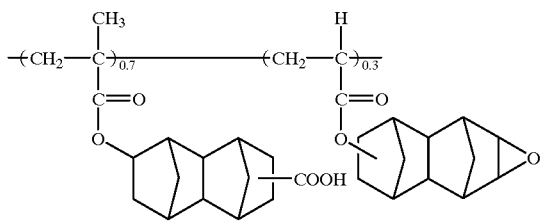

The procedure of Synthesis Example 1 was performed through use of 3,4-epoxytetracyclo[$4.4.0.1^{2,5}.1^{7,10}$]dodecyl acrylate instead of 3,4-epoxytricyclo[$5.2.1.0^{2,6}$]decyl acrylate, to thereby obtain the above polymer (Mw=18,300, Mw/Mn=2.38).

Synthesis Example 12

Synthesis of the below-described polymer (formula (1), wherein each of $R^1$ and $R^5$ represents a methyl group; $R^2$ represents a tetracyclo[$4.4.0.1^{2,5}.1^{7,10}$]dodecanediyl group; $R^3$ represents a hydrogen atom; $R^4$ represents a 3,4-epoxytricyclo[$5.2.1.0^{2,6}$]decyl group; $R^6$=a methyl group; x=0.6; y=0.3; and z=0.1).

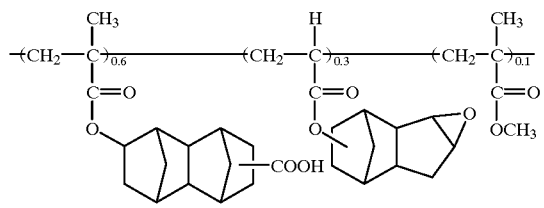

Carboxytetracyclododecyl methacrylate (2.636 g), 3,4-epoxytricyclo[$5.2.1.0^{2,6}$]decyl acrylate (1 g), and methyl methacrylate (0.152 g) were dissolved in anhydrous tetrahydrofuran (25 ml) in a 100 ml round-bottomed flask equipped with a reflux condenser. AIBN (206 mg, 50 mmol/L) was added thereto and the mixture was stirred at 60–65° C. in an argon atmosphere. Two hours later, the mixture was allowed to cool and was poured into ligroin (300 ml). The precipitated pellet was separated by filtration and was further purified by another reprecipitation to thereby obtain a target polymer (2.462 g, yield 65%, Mw=25,800, and Mw/Mn=2.24).

Synthesis Example 13

Synthesis of the below-described polymer (formula (1), wherein each of $R^1$ and $R^5$ represents a methyl group; $R^2$ represents a tetracyclo[$4.4.0.1^{2,5}.1^{7,10}$]dodecyl group; $R^3$ represents a hydrogen atom; $R^4$ represents a 3,4-epoxytricyclo[$5.2.1.0^{2,6}$]decyl group; $R^6$ represents a tricyclodecyl group; x=0.6; y=0.3; and z=0.1).

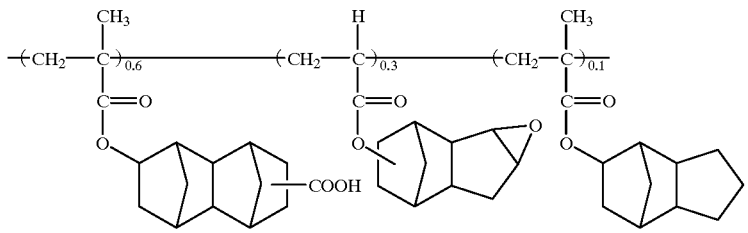

The procedure of Synthesis Example 12 was performed through use of tricyclodecyl methacrylate (FA-513M, product of Hitachi Chemical Co., Ltd.) instead of methyl methacrylate, to thereby obtain the above polymer (Mw=21,600, Mw/Mn=2.32).

Synthesis Example 14

Synthesis of the below-described polymer (formula (1), wherein $R^1$ represents a methyl group; $R^2$ represents a tetracyclo[$4.4.0.1^{2,5}.1^{7,10}$]dodecanediyl group; $R^3$ represents a hydrogen atom; $R^4$ represents a 5(6)-epoxyethyl-2-bicyclo[2.2.]heptyl group; x=0.7; y=0.3; and z=0).

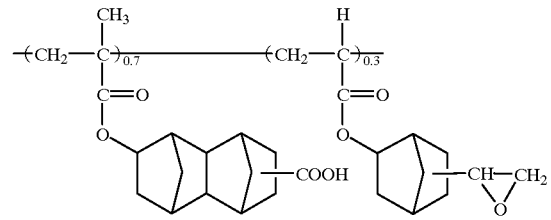

The procedure of Synthesis Example 1 was performed through use of 5(6)-epoxyethyl-2-bicyclo[2.2.1]heptyl acrylate instead of 3,4-epoxytricyclo[$5.2.1.0^{2,6}$]decyl acrylate, to thereby obtain the above polymer (Mw=16,800, Mw/Mn=2.29).

Synthesis Example 15

Synthesis of the below-described polymer (formula (2), wherein each of $R^1$ and $R^5$ represents a methyl group; $R^2$ represents a tetracyclo[$4.4.0.1^{2,5}.1^{7,10}$]dodecanediyl group; $R^6$ represents a tricyclodecyl group; x=0.7 and z=0.3).

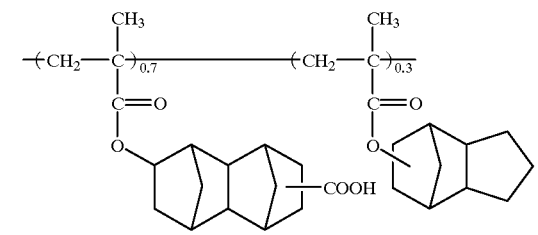

The procedure of Synthesis Example 1 was performed through use of tricyclodecyl methacrylate instead of 3,4-epoxytricyclo[$5.2.1.0^{2,6}$]decyl acrylate, to thereby obtain the above polymer (Mw=19,400, Mw/Mn=2.08).

Synthesis Example 16

Synthesis of the below-described polymer (formula (1), wherein each of $R^1$ and $R^3$ represents a hydrogen atom; $R^2$ represents a tetracyclo[$4.4.0.1^{2,5}.1^{7,10}$]dodecanediyl group; $R^4$ represents a 5(6)-epoxyethyl-2-bicyclo[2.2.1]heptyl group; x=0.38; y=0.62; and z=0).

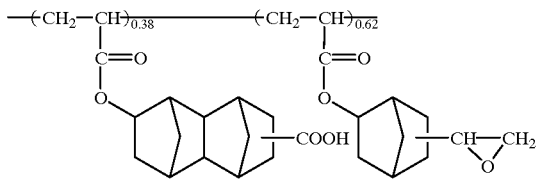

Carboxytetracyclo[4.4.0.1$^{2,5}$,1$^{7,10}$]dodecyl acrylate (4 g) and 5(6)-epoxytricyclodecyl acrylate (4.92 g) were dissolved in anhydrous tetrahydrofuran (49 ml) in a 100 ml round-bottomed flask equipped with a reflux condenser. AIBN (24 mg, 30 mmol/L) was added thereto and the mixture was stirred at 60–65° C. in an argon atmosphere. Two hours later, the mixture was allowed to cool and was poured into ligroin (500 ml). The precipitate was separated by filtration and was further purified by another reprecipitation to thereby obtain a target polymer (7.75 g, yield 87%). The monomer ratio in the copolymer as determined by the integral area ratio of $^1$H-NMR was x=0.38 and y=0.62. The weight average molecular weight (Mw) was 10,600 (reduced to polystyrene) and the polydispersity (Mw/Mn) was 1.67, as determined by GPC analysis.

Synthesis Example 17

Synthesis of a polyhydric alcohol (2,3-dihydroxy-5(6)-hydroxymethylnorbornane) having the below-described structure.

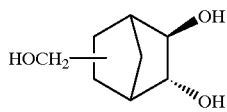

2-Hydroxymethyl-5-norbornene (11 g) was dissolved in pyridine (21 ml), and acetic anhydride (11 ml) was added dropwise thereto. The mixture was stirred for 12 hours at room temperature. The reaction mixture was poured in water (100 ml), and the organic phase was extracted with ethyl acetate (100 ml). The obtained organic phase was washed successively with 0.5 N hydrochloric acid, a 3% aqueous sodium carbonate solution, and saturated brine, and was then dried over magnesium sulfate. Ethyl acetate was removed therefrom by distillation under reduced pressure, to thereby obtain 2-acetoxy-5-norbornene (13 g), which was added dropwise to a mixture of 90% formic acid (50 ml) and a 30% aqueous hydrogen peroxide solution (13 ml) with cooling on ice. The mixture was stirred for 12 additional hours at room temperature. Formic acid was removed therefrom by distillation under reduced pressure, and methanol (30 ml), sodium hydroxide (13 g), and water (25 ml) were added to the residue. The mixture was allowed to react at 45–50° C. for one hour and then to cool. The organic phase was extracted with ethyl acetate (100 ml), washed with saturated brine, and dried over magnesium sulfate. The solvent was removed therefrom by distillation under reduced pressure, to thereby obtain 2,2-dihydroxy-5(6)-hydroxymethylnorbornane (5 g). IR (KBr) 3380 (vO-H), 2950 and 2860 (vC-H), and 1050 (vC-O).

Synthesis Example 18

Synthesis of a polyhydric alcohol (2(3)-hydroxy-5(6)-bis(hydroxymethyl)norbornane) having the below-described structure.

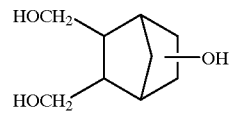

Lithium aluminum hydride (7.63 g) was added in anhydrous THF (100 ml), and 5-norbornene-2,3-dicarboxylic anhydride (30 g) dissolved in anhydrous THF was added dropwise thereto in a nitrogen atmosphere. The mixture was further allowed to react for three hours at room temperature. The reaction mixture was poured in ice-cooled water (300 ml), and the solution was made acidic through addition of diluted sulfuric acid. The organic phase was extracted with ethyl acetate (150 ml×3) and dried over magnesium sulfate. Ethyl acetate was removed therefrom by distillation under reduced pressure. Hexane (100 ml) was added to the residue, and the deposited white crystals were separated by filtration to thereby obtain 2,3-bis(hydroxymethyl)-5-norbornene (10 g), of which 1.2 g were dissolved in anhydrous THF (10 ml), and the mixture was then cooled to 0° C. A borane-tetrahydrofuran complex (1 M) dissolved in THF (10 mL) was added dropwise thereto, and the mixture was allowed to react for one hour at 0° C. and for an additional one hour at room temperature, then cooled to 0° C. To the reaction mixture, water (10 ml), a 3 M aqueous sodium hydroxide solution (22 ml), and a 30% aqueous hydrogen peroxide solution were successively added dropwise. Then, the mixture was allowed to react for one hour at room temperature. Sodium chloride was added thereto, and the aqueous phase was separated. The organic phase was dried over magnesium sulfate, and THF was removed therefrom by distillation under reduced pressure, to thereby obtain the target compound as white crystals (0.8 g). IR (KBr) 3390 (vO-H), 2955 and 2870 (vC-H), and 1045 (vC-O).

Evaluation of Etch Resistance of the Polymers

The resin obtained through Synthesis Example 1 (2 g) was dissolved in diethylene glycol dimethyl ether (10 g) and the solution was filtered by use of a Teflon filter (0.2 μm). The filtrate was applied onto a 3-inch silicon substrate by spin-coating and baked on a hot plate at 90° for 60 seconds to form a thin film having a thickness of 0.7 μm. The etch rate of the obtained film to $CF_4$ gas was measured by use of the DEM451 reactive ion etching (RIE) apparatus (etching conditions: power=100 W, pressure=5 Pa, gas flow rate=30 sccm (5 Pa)). The results are shown in Table 5. The etch rate of the resin obtained through Synthesis Example 13 was also measured in a similar manner. There are also shown results of coated films of novorak resist (PFI-15A, product of Sumitomo Chemical Co., Ltd.), poly(p-vinylphenol) used as a base resin of a KrF resist, and poly(methyl methacrylate) having no bridged hydrocarbon group in the molecular structure. These etch rates were normalized with respect to the etch rate of the novorak resist.

TABLE 5

|  | Etch rate (normalized) |
| --- | --- |
| Synthesis Example 1 | 1.1 |
| Synthesis Example 13 | 1.05 |
| poly(methyl methacrylate) | 1.9 |
| poly(p-vinylphenol) | 1.2 |
| novorak resist (PFI-15A) | 1 |

As evident from the above results, the resins used in the present invention show low etch rates to $CF_4$ gas and excellent dry-etch resistance.

Example 1

A resist having a composition described below was prepared:

(a) polymer (Synthesis Example 1): 2 g;
(b) photoacid generator (triphenylsulfonium triflate): 0.02 g; and
(d) ethyl lactate: 10.5 g.

The mixture was filtered by use of a Teflon filter (0.2 μm), and was then applied onto a 3-inch quartz substrate through spin-coating and baked on a hot plate at 100° for one minute to thereby form a thin film having a thickness of 1 μm.

The transmittance of this thin film was measured by use of a UV-visible spectrophotometer at 193.4 nm, which is the principal wavelength of the ArF excimer laser beam. The transmittance of the resin obtained through Synthesis Example 13 was measured in a similar manner.

The results show that the transmittance was 53%/μm for the thin film containing the polymer obtained through Synthesis Example 1 and 56%/μm for that obtained through Synthesis Example 13. Based on the results, the resist materials of the present invention are confirmed to show sufficient transparency as a single layer resist.

Example 2

The resist obtained through Example 1 was formed into a film having a thickness of 0.5 μm on an Si substrate to thereby obtain a wafer, which was allowed to stand stationary in a contact-exposure test apparatus that had been well-purged with nitrogen. The wafer was closely covered with a mask comprising a quartz substrate coated with patterned chromium and exposed to an ArF excimer laser through the mask. Immediately after the exposure, the wafer was baked on a hot plate at 140° for 60 seconds, developed with a 2.38% aqueous TMAH solution (23° C.) through the 60-second dipping method, and successively rinse-treated with pure water for 60 seconds. The process resulted in selective removal of an unexposed area of the resist film through dissolution by the developer, to obtain a negative pattern.

The results show that a resolution of 0.25 μmL/S and a sensitivity of 30 mJ/cm$^2$ were obtained for the resist containing the polymer obtained through Synthesis Example 1, and that a resolution of 0.24 μmL/S and a sensitivity of 45 mJ/cm$^2$ were obtained for the polymer obtained through Synthesis Example 13. The photoresist materials of the present invention were proven to have excellent resolution characteristics. Since no phenomenon such as peel-off of patterns was observed, excellent adhesion to a substrate was confirmed.

Example 3

A resist having a composition described below was prepared:

(a) polymer (Synthesis Example 1): 2 g;
(b) photoacid generator (triphenylsulfonium triflate): 0.02 g;
(c) alicyclic epoxy compound EHPE-3150 (product of Daicel Chemical Industries, Ltd.): 0.4 g; and
(d) ethyl lactate: 10.5 g.

The procedure of Example 2 was performed so as to evaluate the patterning. The results show a resolution of 0.22 μmL/S and a sensitivity of 20 mJ/cm$^2$ for the above-described resist.

A resist was prepared in a similar manner by use of trisepoxypropyl isocyanurate (Nissan Chemical Industries, Ltd.) instead of alicyclic epoxy compound EHPE-3150 (product of Daicel Chemical Industries, Ltd.) and evaluated. The results show a resolution of 0.22 μmL/S and a sensitivity of 16 mJ/cm$^2$

Example 4

A resist having a composition described below was prepared:

(a) polymer (Synthesis Example 15): 2 g;
(b) photoacid generator (triphenylsulfonium triflate): 0.02 g;
(c) alicyclic epoxy compound EHPE-3150 (product of Daicel Chemical Industries, Ltd.): 0.8 g; and
(d) ethyl lactate: 10.5 g.

The procedure of Example 2 was performed so as to evaluate the patterning. The results show a resolution of 0.22 μmL/S and a sensitivity of 50 mJ/cm$^2$ for the resist.

A resist was prepared in a similar manner by use of trisepoxypropyl isocyanurate (Nissan Chemical Industries, Ltd.) instead of alicyclic epoxy compound EHPE-3150 (product of Daicel Chemical Industries, Ltd.) and evaluated. The results show a resolution of 0.22 μmL/S and a sensitivity of 60 mJ/cm$^2$.

Example 5

A resist having a composition described below was prepared:

(a) polymer (Synthesis Example): 2 g;
(b) polyhydric alcohol (Synthesis Example 17): 0.3 g;
(c) photoacid generator (triphenylsulfonium triflate (TPS)): 0.02 g; and
(d) ethyl lactate: 10.5 g.

The mixture was filtered by use of a Teflon filter (0.2 μm), to thereby obtain a resist. The resist was applied onto a 3-inch quartz substrate through spin-coating and baked on a hot plate at 100° for one minute to thereby form a thin film having a thickness of 1 μm. The transmittance of this thin film was measured by use of a UV-visible spectrophotometer at 193.4 nm, which is the principal wavelength of the ArF excimer laser. The transmittance of the resin obtained through Synthesis Example 13 was measured in a similar manner.

The results show that the transmittance was 56%/μm for the thin film containing the polymer obtained through Synthesis Example 1 and 61%/μm for that obtained through Synthesis Example 13. Based on the results, the resist materials of the present invention are confirmed to show sufficient transparency as a single layer resist.

Example 6

Resists 1 to 6 having compositions shown in Table 6 were prepared. Each of the resists was formed into a film having a thickness of 0.5 μm on an Si substrate to thereby obtain a wafer, which was allowed to stand stationary in a contact-exposure test apparatus that had been well-purged with nitrogen. The wafer was closely covered with a mask 3 comprising a quartz substrate coated with patterned chromium and was exposed to an ArF excimer laser through the mask. Immediately after the exposure, the wafer was baked on a hot plate at 140° for 60 seconds, developed with a 2.38% aqueous TMAH solution (23° C.) through use of the 60-second dipping method, and successively rinse-treated with pure water for 60 seconds. The process resulted in selective removal of an unexposed area of the resist film through dissolution by the developer, to obtain a negative pattern. The results are shown in Table 6 in terms of sensitivity and resolution. A resist to which polyhydric alcohol had not been added was also evaluated in a similar manner.

TABLE 6

| Resist* | Polymer | Photoacid generator | Polyhydric alcohol | Resolution ($\mu$mL/S) | Sensitivity (mJ/cm$^2$) |
|---|---|---|---|---|---|
| 1 | Synth. Ex. 1 | TPS | Synth. Ex. 17 | 0.21 | 9 |
| 2 | Synth. Ex. 13 | TPS | Synth. Ex. 17 | 0.21 | 8 |
| 3 | Synth. Ex. 16 | TPS | Synth. Ex. 17 | 0.19 | 5 |
| 4 | Synth. Ex. 16 | TPS | Synth. Ex. 18 | 0.19 | 4 |
| 5 | Synth. Ex. 16 | TPS | tricyclo decane- dimethanol | 0.20 | 5.5 |
| 6 | Synth. Ex. 16 | TPS | 1,4-cyclo hexanediol | 0.20 | 6.5 |
| Example 2 | Synth. Ex. 1 | TPS | none | 0.25 | 30 |

*Resists were prepared through dissolving the corresponding polymer (2 g), photoacid generator (0.02 g), and polyhydric alcohol (0.3 g) in ethyl lactate (10.5 g).

The above results reveal that the negative photoresist materials of the present invention have excellent resolution characteristics. Since no phenomenon such as peel-off of patterns was observed, excellent adhesion to a substrate was confirmed.

Furthermore, addition of polyhydric alcohol has proven to enhance the resolution and sensitivity.

Example 7

A resist having a composition described below was prepared:

(a) polymer (Synthesis Example 1): 2 g;
(b) polyhydric alcohol (Synthesis Example 17): 0.2 g;
(c) photoacid generator (triphenylsulfonium triflate): 0.02 g;
(d) alicyclic epoxy compound EHPE-3150 (product of Daicel Chemical Industries, Ltd.): 0.2 g; and
(e) ethyl lactate: 10.5 g.

The procedure of Example 6 was performed so as to evaluate patterning. The results show a resolution of 0.21 $\mu$mL/S and a sensitivity of 7 mJ/cm$^2$ for the above-described resist.

Example 8

A resist having a composition described below was prepared:

(a) polymer (Synthesis Example 15): 2 g;
(b) polyhydric alcohol (Synthesis Example 18): 0.2 g;
(c) photoacid generator (triphenylsulfonium triflate): 0.02 g;
(d) alicyclic epoxy compound EHPE-3150 (product of Daicel Chemical Industries, Ltd.): 0.4 g; and
(e) ethyl lactate: 10.5 g.

The procedure of Example 6 was performed so as to evaluate patterning. The results show a resolution of 0.22 $\mu$mL/S and a sensitivity of 9.5 mJ/cm$^2$ for the above-described resist.

What is claimed is:

1. A negative photoresist material comprising a polymer having a weight average molecular weight of 1,000–500,000 and represented by the following formula (1):

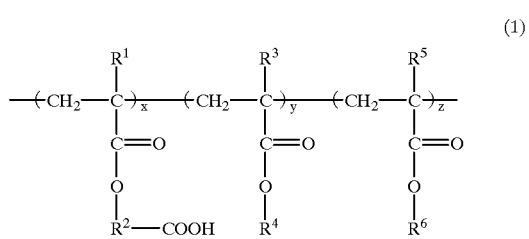

wherein each of $R^1$, $R^3$, and $R^5$ represents a hydrogen atom or a methyl group; $R^2$ represents a $C_{7-18}$ divalent hydrocarbon group having a bridged cyclic hydrocarbon group; $R^4$ represents a hydrocarbon group having an epoxy group; $R^6$ represents a hydrogen atom or a $C_{1-12}$ hydrocarbon group; and each of x, y, and z represents an arbitrary number satisfying the following conditions: x+y+z=1, 0<x<1, 0<y<1, and 0≦z<1; and a photoacid generator generating an acid through exposure.

2. A negative photoresist material comprising a polymer having a weight average molecular weight of 1,000–500,000 and represented by the following formula (1):

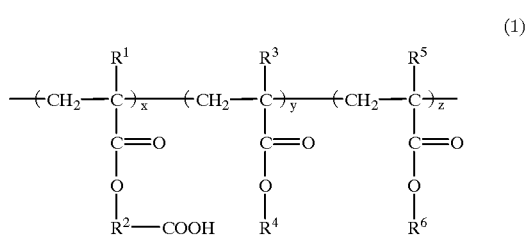

wherein each of $R^1$, $R^3$, and $R^5$ represents a hydrogen atom or a methyl group; $R^2$ represents a $C_{7-18}$ divalent hydrocarbon group having a bridged cyclic hydrocarbon group; $R^4$ represents a hydrocarbon group having an epoxy group; $R^6$ represents a hydrogen atom or a $C_{1-12}$ hydrocarbon group; and each of x, y, and z represents an arbitrary number satisfying the following conditions: x+y+z=1, 0<x<1, 0<y<1, and 0≦z<1; a photoacid generator generating an acid through exposure, and a polyhydric alcohol.

3. The photoresist material according to claim 1, further comprising a polyfunctional epoxy compound.

4. The photoresist material according to claim 2, further comprising a polyfunctional epoxy compound.

5. A negative photoresist material comprising a polymer having a weight average molecular weight of 1000–500,000 and represented by the following formula (2):

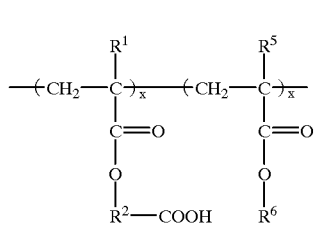
(2)

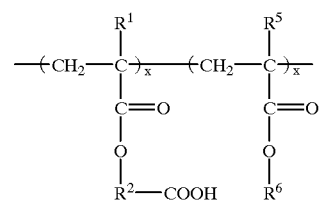
(2)

wherein each $R^1$ and $R^5$ represents a hydrogen atom or a methyl group; $R^2$ represents a $C_{7-18}$ divalent hydrocarbon group having a bridged cyclic hydrocarbon group; $R^6$ represents a hydrogen atom or a $C_{1-12}$ hydrocarbon group; each of x and z represents an arbitrary number satisfying the following conditions: x+z=1, 0<x<1, and 0≦z<1; a photoacid generator generating an acid through exposure; and a polyfunctional epoxy compound.

6. A negative photoresist material comprising a polymer having a weight average molecular weight of 1000–500,000 and represented by the following formula (2):

wherein each $R^1$ and $R^5$ represents a hydrogen atom or a methyl group; $R^2$ represents a $C_{7-18}$ divalent hydrocarbon group having a bridged cyclic hydrocarbon group; $R^6$ represents a hydrogen atom or a $C_{1-12}$ hydrocarbon group; each of x and z represents an arbitrary number satisfying the following conditions: x+z 1, 0<x<1, and 0≦z<1; a photoacid generator generating an acid through exposure; a polyfunctional epoxy compound; and a polyhydric alcohol.

* * * * *